(12) United States Patent
Jacobsson et al.

(10) Patent No.: US 6,891,444 B2
(45) Date of Patent: May 10, 2005

(54) OSCILLATOR CIRCUIT FOR LOCKING TWO OR MORE LC-OSCILLATORS BY MUTUAL INDUCTANCE COUPLING

(75) Inventors: Harald Jacobsson, Vastra Frölunda (SE); Spartak Gevorgian, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/751,105

(22) Filed: Jan. 5, 2004

(65) Prior Publication Data

US 2004/0178857 A1 Sep. 16, 2004

Related U.S. Application Data

(63) Continuation of application No. PCT/SE02/01206, filed on Jun. 20, 2002.

(30) Foreign Application Priority Data

Jul. 5, 2001 (SE) .............................................. 0102420

(51) Int. Cl.[7] ................................................ H03B 5/12
(52) U.S. Cl. .................. 331/117 R; 331/46; 331/108 B
(58) Field of Search ........................ 331/117 R, 108 B, 331/46, 50, 56, 45, 167, 113 R

(56) References Cited

U.S. PATENT DOCUMENTS

| 5,379,457 | A | | 1/1995 | Nguyen ........................ 455/323 |
| 5,912,596 | A | * | 6/1999 | Ghoshal .................. 331/117 R |
| 6,249,190 | B1 | | 6/2001 | Rozenblit et al. ............. 831/46 |
| 2004/0066241 | A1 | * | 4/2004 | Gierkink et al. .............. 331/46 |

FOREIGN PATENT DOCUMENTS

| EP | 0909018 A1 | 4/1999 |
| GB | 2338849 A1 | 12/1999 |

* cited by examiner

Primary Examiner—Robert Pascal
Assistant Examiner—Joseph Chang
(74) Attorney, Agent, or Firm—Nixon & Vanderhye P.C.

(57) ABSTRACT

A method of locking a first LC-oscillator with a second LC-oscillator and a circuit and an arrangement therefore. The method comprises coupling by mutual inductance a resonance inductor of the first LC-oscillator with a resonance inductor of the second LC-oscillator. A development of an oscillator circuit according to the invention comprising two locked differential LC-oscillators is an oscillator arrangement locking together two oscillator circuits by AC coupling fundamental frequency AC-ground points of the two oscillator circuits.

31 Claims, 7 Drawing Sheets

OSCILLATOR CIRCUIT FOR LOCKING TWO OR MORE LC-OSCILLATORS BY MUTUAL INDUCTANCE COUPLING

This application is a continuation of PCT International Application No. PCT/SE02/01206, filed in English on 20 Jun. 2002, which designated the US. PCT/SE02/01206 claims priority to SE Application No. 0102420-7 filed 5 Jul. 2001. The entire contents of these applications are incorporated herein by reference.

TECHNICAL FIELD

The invention concerns oscillators and is more particularly directed to the locking of two or more oscillators together, especially LC-oscillators.

BACKGROUND

Oscillators are used in most types of electronic circuitry. In some applications the frequency accuracy and stability are of a lesser importance, in other applications it is extremely important that an oscillator has a pure frequency spectrum with a very low phase noise. One type of application where these demands are set very high is in communication systems. Oscillators in communication systems are often considered as building blocks that ought to be small, preferably integrated, have a low manufacturing cost, be reliable, have a low power consumption and also fulfill among the most strict signal quality requirements. Obtaining these characteristics is a difficult task, especially if the oscillator building block is to be realized on an integrated circuit with a limited semiconductor area available and a limited available power, without any external components.

There have been several attempts to come to grips with these contradictory but very desirable oscillator qualities. One way to improve the phase noise of an oscillator is to lock two oscillators together. This has traditionally led to more than a doubled required semiconductor area to avoid that the resonators of the oscillators interfere with each other, and to make room for the additional circuitry required to lock them together. This additional circuitry, apart from the additional oscillator, will increase the total power consumption of the building block. Increased power and increased occupied area are particularly undesirable oscillator building block characteristics for portable, usually battery powered communication equipment, such as cellular phones. There seem to still exist room for improvement on oscillator building blocks.

SUMMARY

An object of the invention is to define a method of reducing phase noise of oscillators, especially LC-oscillators.

A further object of the invention is to define a method of improving oscillator characteristics, especially the characteristics of LC-oscillators.

A still further object of the invention is to define an LC-oscillator with a low phase noise.

The aforementioned objects are achieved according to the invention by a method of frequency locking a first LC-oscillator with at least a second LC-oscillator and a circuit and also an arrangement therefore. The method comprises coupling by mutual inductance a resonance inductor of the first LC-oscillator with a resonance inductor of the at least second LC-oscillator. A resonance inductor is an inductor of the resonance circuit of the LC oscillator in question, i.e. the L (or at least a part of it) in LC. A development of an oscillator circuit according to the invention comprising two locked differential LC-oscillators is an oscillator arrangement frequency locking together at least two oscillator circuits by AC coupling fundamental frequency AC-ground points of the two oscillator circuits.

The aforementioned objects are also achieved according to the invention by an oscillator circuit comprising a first LC-oscillator and a second LC-oscillator. The first LC-oscillator comprises a resonance inductor, the second LC-oscillator comprises a resonance inductor. The first LC-oscillator and the second LC-oscillator have substantially the same fundamental frequencies. According to the invention the resonance inductor of the first LC-oscillator is inductively coupled by mutual inductance to the resonance inductor of the second LC-oscillator. Thereby the first LC-oscillator and the second LC-oscillator can frequency lock to each other.

In some embodiments the oscillator circuit comprises a third LC-oscillator. The third LC-oscillator comprises a resonance inductor, and the resonance inductor of the third LC-oscillator is inductively coupled by mutual inductance to at least one of the other resonance inductors of the other LC-oscillators. In some of these embodiments the oscillator circuit comprises a fourth LC-oscillator. The fourth LC-oscillator comprises a resonance inductor, and the resonance inductor of the fourth LC-oscillator is inductively coupled by mutual inductance to at least one of the other resonance inductors of the other LC-oscillators.

In other embodiments the oscillator circuit comprises an arbitrary number of further LC-oscillators. Each further LC-oscillator comprises a resonance inductor, and each of the resonance inductors of the further LC-oscillators is inductively coupled by mutual inductance to at least one of the other resonance inductors of the other LC-oscillators.

In some embodiments the inductive coupling by mutual inductance between the resonance inductors of the LC-oscillators is achieved by at least partly intertwining the inductor windings of the respective resonance inductors which are inductively coupled by mutual inductance. The LC-oscillators can suitably have substantially identical circuitry. Advantageously a fundamental frequency of the LC-oscillators is substantially a same frequency for all of the LC-oscillators.

In some embodiments the LC-oscillators are differential LC-oscillators, where each differential LC-oscillator comprises at least one fundamental frequency AC-ground due to the differential symmetry.

The aforementioned objects are further achieved according to the invention by a communication unit, where the communication unit comprises an oscillator circuit according to any previously described embodiment.

The aforementioned objects are further achieved according to the invention by an oscillator arrangement comprising a first oscillator circuit and a second oscillator circuit, each oscillator circuit being according to the previously described embodiments where each LC-oscillator is a differential LC-oscillator comprising at least one fundamental frequency AC-ground due to the differential symmetry. According to the invention the oscillator arrangement comprises a first AC coupling between one of the at least one fundamental frequency AC-ground points of the first oscillator circuit and one of the at least one fundamental frequency AC-ground points of the second oscillator circuit, thus locking the first oscillator circuit to the second oscillator circuit.

Suitably the first oscillator circuit and the second oscillator circuit are substantially identical. Advantageously the first AC coupling is between a first fundamental frequency AC-ground point of the first oscillator circuit and a first fundamental frequency AC-ground point of the second oscillator circuit, the first fundamental frequency AC-ground points being identical fundamental frequency AC-ground points.

In some embodiments the oscillator arrangement comprises a second AC coupling between a second fundamental frequency AC-ground point of the first oscillator circuit and a second fundamental frequency AC-ground point of the second oscillator circuit, the second fundamental frequency AC-ground points being identical fundamental frequency AC-ground points.

Some embodiments of the oscillator arrangement comprise a third similar oscillator circuit. Suitably either the first AC coupling is further AC coupled to a first fundamental frequency AC-ground point of the third oscillator circuit, or suitably the oscillator circuit comprises a second AC coupling between a second fundamental frequency AC-ground point of the first oscillator circuit and a second fundamental frequency AC-ground point of the third oscillator circuit, the second fundamental frequency AC-ground points being identical fundamental frequency AC-ground points and separate from the first fundamental frequency AC-ground points.

The third oscillator circuit can suitably either have a substantially a same fundamental frequency as the first and second oscillator circuits, or have a fundamental frequency which is substantially twice the frequency as the fundamental frequencies of the first and second oscillator circuits.

Some embodiments of the oscillator arrangement comprise a fourth similar oscillator circuit. Suitably either the first AC coupling is further AC coupled to a first fundamental frequency AC-ground point of the fourth oscillator circuit, or the oscillator arrangement further comprises a third AC coupling between a fundamental frequency AC-ground point of the second oscillator circuit being separate from the first fundamental frequency AC-ground point of the second oscillator circuit and a corresponding fundamental frequency AC-ground point of the fourth differential oscillator.

Advantageously the fourth oscillator circuit can have a fundamental frequency which is substantially the frequency of the fundamental frequency of the first and second oscillator circuit, or the fourth oscillator circuit can suitably have a fundamental frequency which is substantially twice the frequency of the fundamental frequency of the first and the second oscillator circuit, or the fourth oscillator circuit can suitably have a fundamental frequency which is substantially twice the frequency of the fundamental frequency of the third oscillator circuit.

In some embodiments one or more of the AC couplings between two or more fundamental frequency AC-ground points, is/are further coupled to a voltage source via an AC-impedance element. In other embodiments one or more AC coupling between two or more fundamental frequency AC-ground points, is/are further coupled to ground via an AC-impedance element.

Suitably one or more of the AC couplings between two or more fundamental frequency AC-ground points is/are direct couplings, and/or one or more of the AC couplings between two or more fundamental frequency AC-ground points is/are resistive couplings, and/or one or more of the AC couplings between two or more fundamental frequency AC-ground points is/are capacitive couplings.

The aforementioned objects are further achieved according to the invention by an oscillator arrangement comprising an arbitrary number, at least two, oscillator circuits, each oscillator circuit being according to the previously described embodiments where each LC-oscillator is a differential LC-oscillator comprising at least one fundamental frequency AC-ground due to the differential symmetry. According to the invention the oscillator arrangement comprises an arbitrary number of AC couplings between fundamental frequency AC-ground points of the oscillator circuits, thus frequency locking the oscillator circuits.

The aforementioned objects are also achieved according to the invention by a communication unit comprising an oscillator arrangement according to any previously described embodiment.

The aforementioned objects are also achieved according to the invention by a method of frequency locking a first LC-oscillator to a second LC-oscillator. According to the invention the method comprises coupling by mutual inductance a resonance inductor of the first LC-oscillator with a resonance inductor of the second LC-oscillator.

By providing an LC-oscillator according to the invention a plurality of advantages over prior art oscillators are obtained. A primary purpose of the invention is to provide an improved LC-oscillator with a high quality signal output. This is obtained according to the invention by inductively coupling resonance inductors of LC-oscillators to frequency lock them together. By locking two or more LC-oscillators together according to the invention the phase noise of each oscillator is reduced by up to 3 n dB, where $2^n$ is the number of coupled oscillators. Further the positive mutual inductance induces currents in the opposite oscillator such that the same voltage swing in the resonator can be maintained at a much lower bias current. In the limit of a coupling factor of 1, the reduction in current bias is a factor two, thus making the power consumption the same as for a single oscillator. Still further by reducing the bias current in each oscillator, the loading of the resonator can be reduced thus increasing the loaded Q. This can improve the phase noise even beyond the 3 dB achieved by locking two oscillators to each other. Also in some embodiments the area consumed by the inductors is only marginally larger than that of a single inductor. Since the inductors often make up a major part of the oscillators' space requirement, the total oscillator area is increased by much less than a factor of two. In some embodiments according to the invention, by reducing the size of the inductors, then apart from reducing the space requirement, the phase noise can be even further reduced at the expense of increased power consumption. And the oscillators lock in such a way that the outputs of the two oscillators are in phase with each other. The phase noise can thus be reduced by 3 dB or more by coupling two LC-oscillators together according to the invention, without occupying much more space and with no extra power consumption. Other advantages of this invention will become apparent from the detailed description.

BRIEF DESCRIPTION OF THE DRAWINGS

The invention will now be described in more detail for explanatory, and in no sense limiting, purposes, with reference to the following figures, in which.

DETAILED DESCRIPTION

In order to clarify the method and device according to the invention, some examples of its use will now be described in connection with FIGS. 1 to 8.

Figure 1:
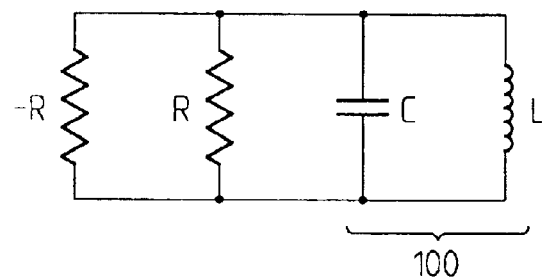
FIG. 1 shows a diagram of the principle of a parallel resonance oscillator.

FIG. 1 shows a parallel resonance LC oscillator. The oscillator comprises a capacitor C and an inductor L in a LC resonance circuit 100. An active drive element represented by a negative resistance −R and a dampening resistance R. The resonance frequency, i.e. the frequency with which the oscillator will oscillate, its fundamental frequency, is approximately given by $f_o=1/(2 \cdot \pi \cdot (L \cdot C)^{1/2})$. That is when the impedance of a parallel resonance circuit is high. If it was a serial resonance LC oscillator, then resonance would occur when the serial resonance circuit has a low impedance. The invention is not restricted to the use of a parallel or a serial resonance LC oscillator, if they are fixed frequency or tunable oscillators, the only restriction the invention puts on the oscillators used, is that they both have an inductor in the resonance circuit.

The invention is based on the idea to let the resonators of two, or more, LC oscillators interfere with each other as much as possible instead of trying to avoid any interference. This desirable interference is achieved by mutual inductance coupling of the inductors of the resonators of the LC oscillators that there is a desire to couple.

Figure 2:
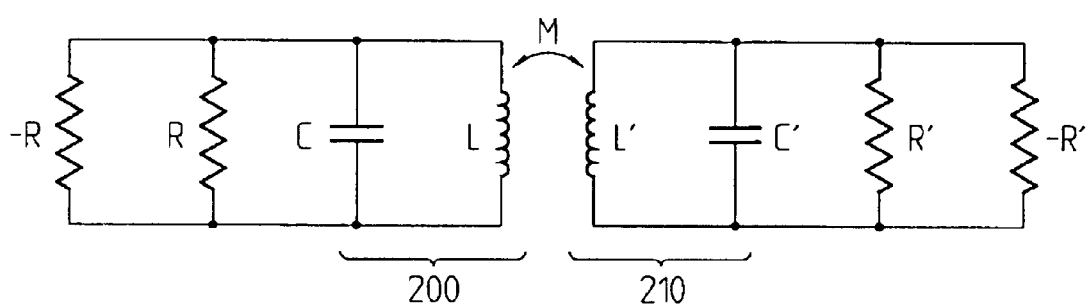
FIG. 2 shows a diagram of the basic principle of the invention.

FIG. 2 shows two parallel resonance LC oscillators coupled for frequency locking according to the invention. Both LC oscillators comprise capacitors C, C' and inductors L, L' in their respective resonance circuit 200, 210. Each LC oscillator further comprises some type of drive means, here also represented by a respective negative resistance element −R, −R', and each oscillator is also dampened R, R'. According to the invention the inductors L, L' of each respective resonance circuit 200, 210 are coupled by a mutual inductance M. The mutual inductance is given by the physical relationship between the inductors L, L'. The resulting coupling coefficient K between the oscillators is given by $K=M/(L \cdot L')^{1/2}$, i.e. it also depends on the size of the inductors. The coupling coefficient can suitably be somewhere between 0.01 and 1, where preliminary testing has shown improved results with increased coupling. The frequency difference between two, or more, LC oscillators that are to be frequency locked according to the invention should preferably only differ in frequency in the order of 50% or less.

As mentioned previously, oscillators as building blocks in communication systems are preferably realized on an integrated circuit without any external components. To avoid using any external components, it is necessary to integrate the inductors. FIGS. 3A to 5B all show examples of track layout of resonance inductors with mutual inductance according to the invention, that are suitable to implement with one or more metal layers within an integrated circuit.

Figure 3A:
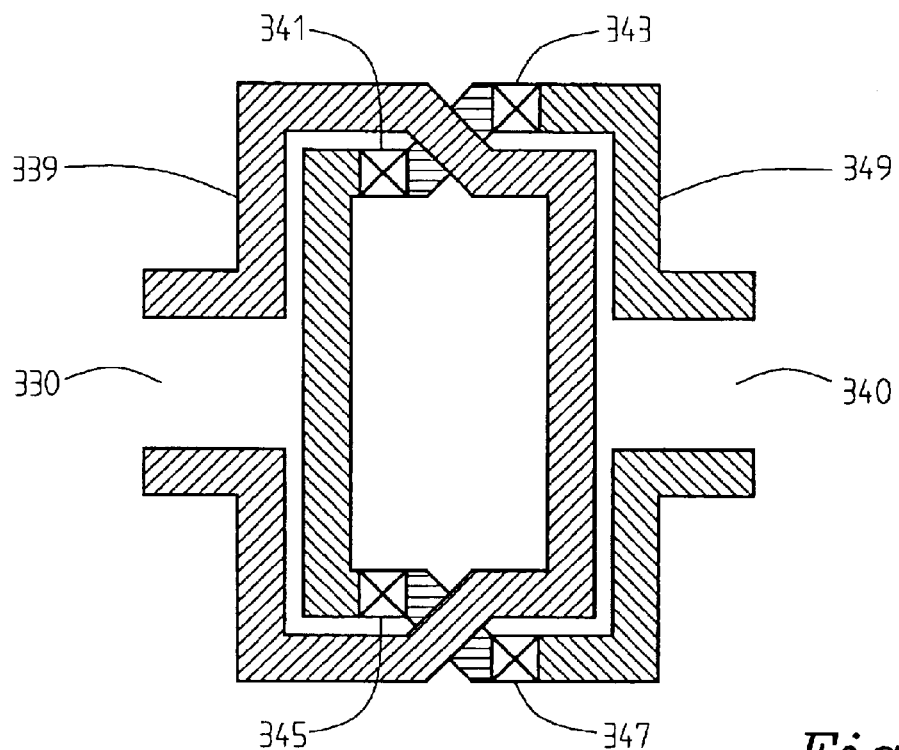
FIG. 3A shows a first example of the track layout of two inductors coupled according to the invention.

FIG. 3A shows a first example of track layout of two resonance circuit inductors with mutual inductance according to the invention. The resonance inductors are in this first example implemented at least substantially in the same metal layer and overlapping. Each inductor comprises connections 330, 340 to the rest of each respective oscillator. The track 339 of the first inductor is in this example unbroken, while the track 349 of the second inductor goes between different layers by means of vias 341, 343, 345, 347 to avoid any physical coupling between the inductors.

Figure 3B:
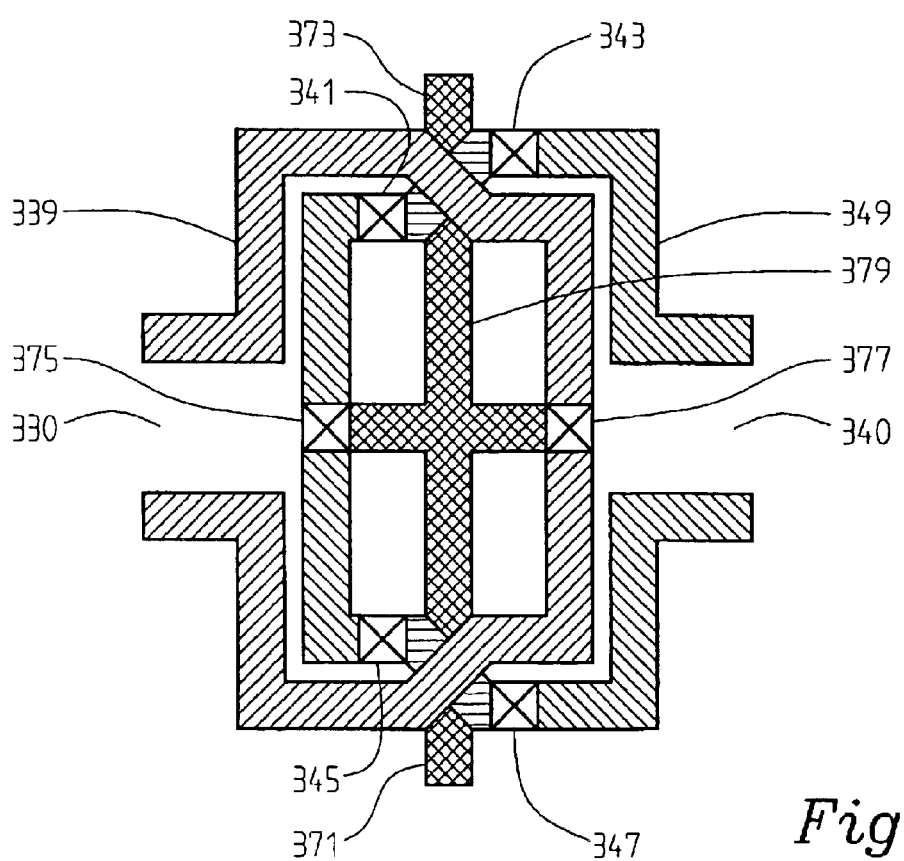
FIG. 3B shows the first example of track layout of two inductors with center tapped biasing.

FIG. 3B shows a similar arrangement to the first example according to FIG. 3A but with the addition of track for DC biasing purposes. Some oscillators need biasing, i.e. a reference voltage or power connection, to be connected by means of a center tap on the resonance inductor. The biasing track 379 can be connected 371, 373 to a voltage source at either end. Vias 375, 377 to connect the biasing track 379 to a center tap of each respective inductor track 339, 349. The biasing track 379 is symmetrical in both directions to give an equal and symmetrical influence to the inductors.

Figure 4A:
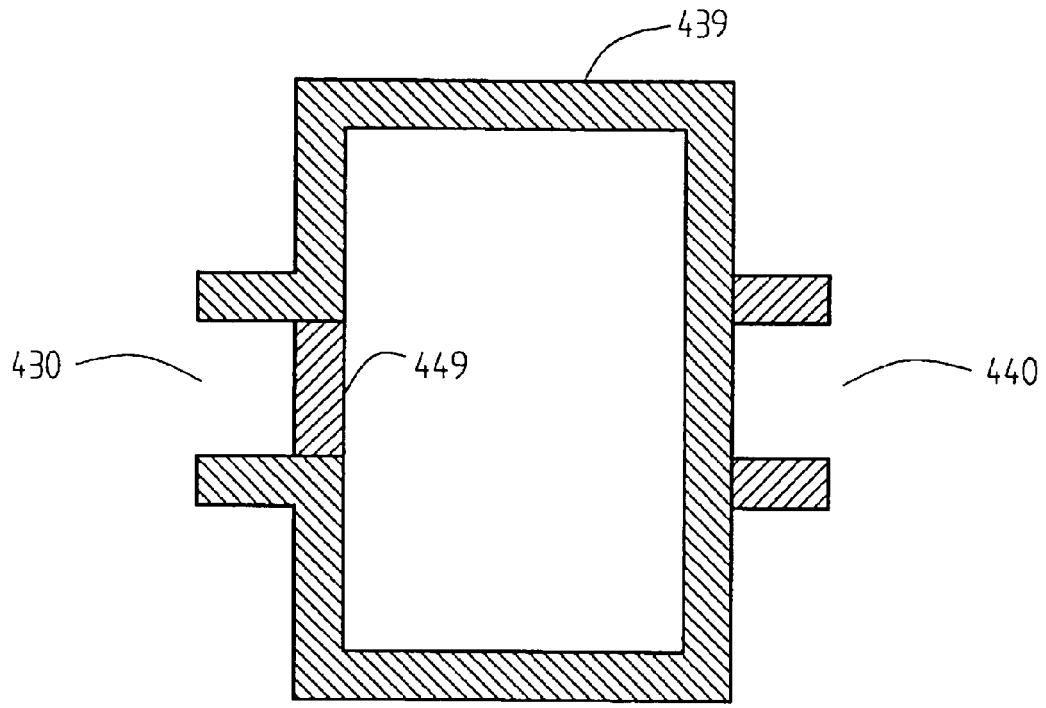
FIG. 4A shows a second example of the track layout of two inductors coupled according to the invention.
Figure 4B:
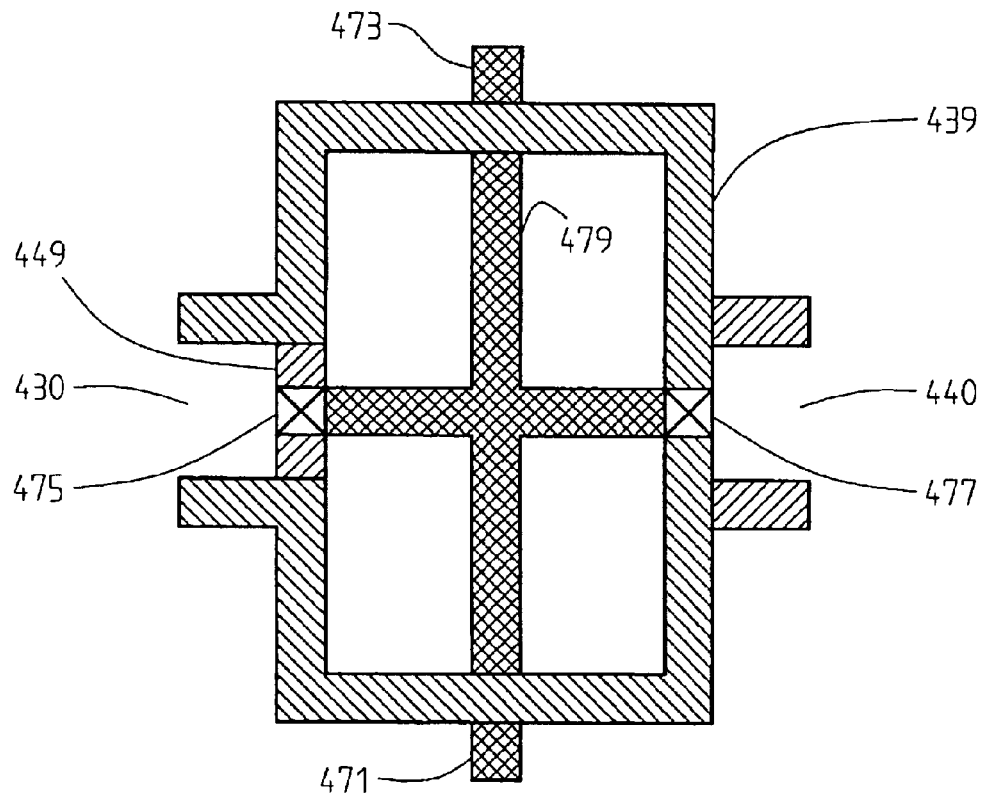
FIG. 4B shows the second example of track layout of two inductors with center tapped biasing.

FIG. 4A shows a second example of track layout of two resonance circuit inductors with mutual inductance coupling according to the invention. Two inductors being laid out on top of each other, i.e. being in different metal layers and overlapping. Each inductor comprises its own connection 430, 440 and unbroken track 439, 449. FIG. 4B shows a similar arrangement as the second example according to FIG. 3B, but with a DC biasing network track 479. The biasing network in this example comprises a voltage source connection 471, 473 at each end. This example also uses vias 475, 477 to connect to a respective center tapped inductor track 439, 449. The biasing track 479 is symmetrical in both directions to give an equal and symmetrical influence to the inductors.

Figure 5A:
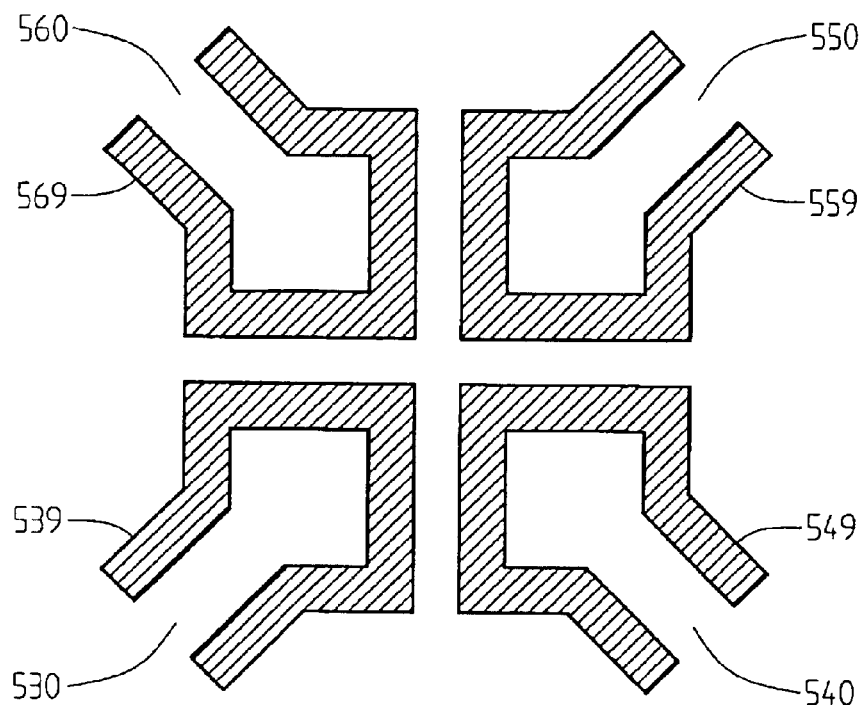
FIG. 5A shows an example of the track layout of four inductors coupled according to the invention.

FIG. 5A shows a third example of track layout of resonance circuit inductor mutual inductance coupling according to the invention. This example includes four inductors that are not overlapping, but that can suitably be in the same metal layer. Each inductor and corresponding inductor track 539, 549, 559, 569 comprises its own connection 530, 540, 550, 560 to the rest of a corresponding oscillator. This example involves four oscillators coupled and frequency locked together by mutual inductance between the resonance inductors of the respective oscillators.

Figure 5B:
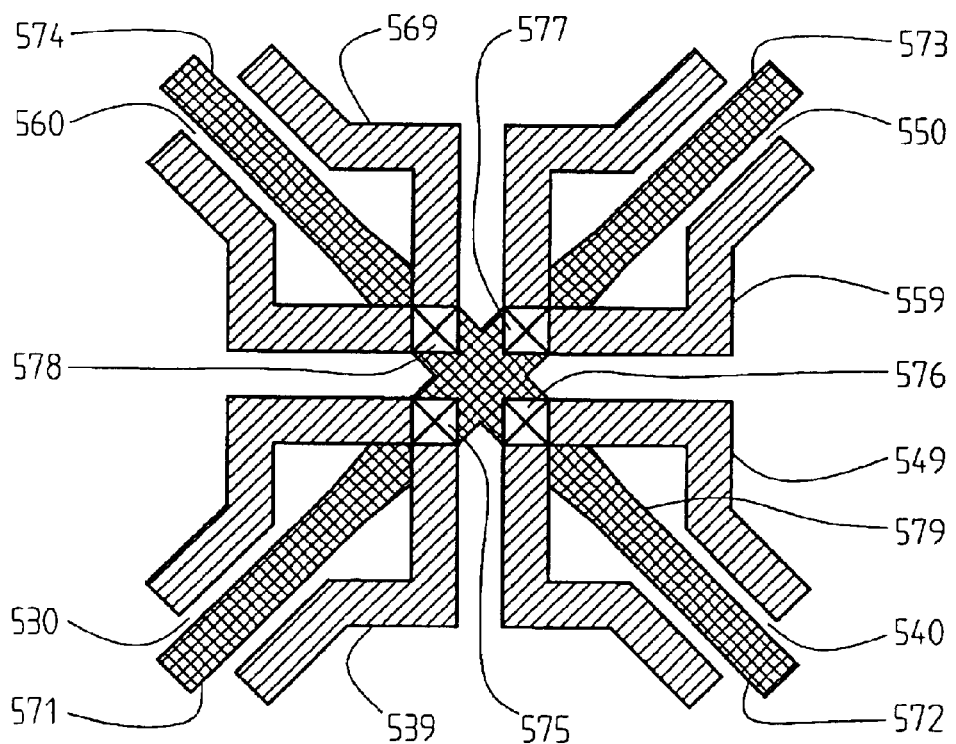
FIG. 5B shows the example of track layout of four inductors with center tapped biasing.

FIG. 5B shows the third example according to FIG. 5A with the addition of center tapped DC biasing to each of the inductors. The biasing network 579 comprises four biasing connections 571, 572, 573, 574, each one in connection with an inductor, and also center tap vias 575, 576, 577, 578 to a corresponding inductor center tap. The biasing network 579 is symmetrical in both directions to give an equal and symmetrical influence to the inductors.

Figure 6:
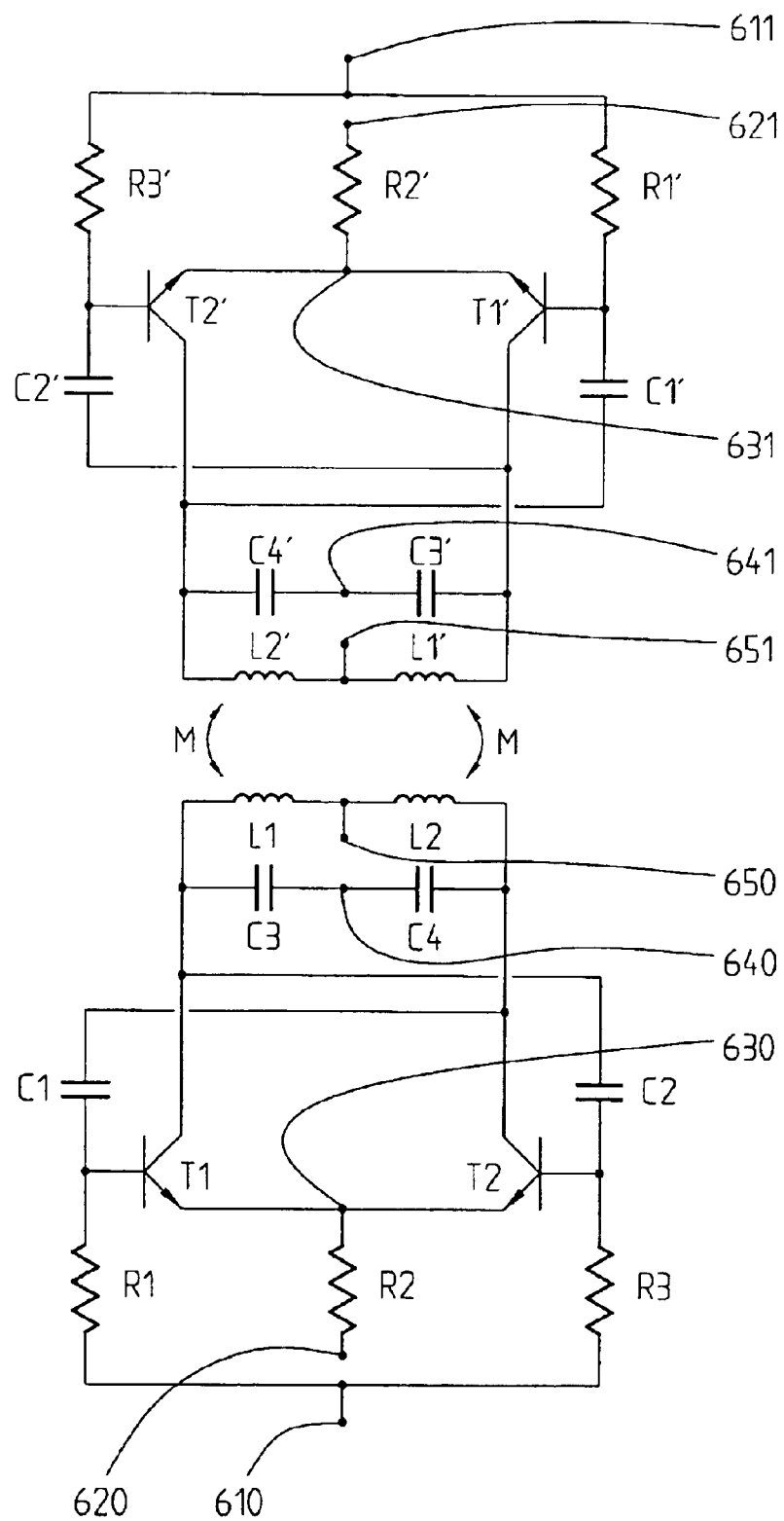
FIG. 6 shows a schematic of two differential LC-oscillators being coupled according to the invention.

As mentioned previously, the invention of frequency locking two or more oscillators to each other by mutual inductance coupling of resonance inductors of the oscillators is not restricted to any type of oscillator, other than that the oscillators in question must have at least one inductor in their respective resonance circuits. FIG. 6 shows a schematic of two differential LC-oscillators being frequency coupled according to the invention by mutual inductance M coupling. Such an oscillator arrangement comprising two differential oscillators that are frequency locked to each other according to the invention by mutual inductance coupling of the resonator inductors, will be referred to as a super oscillator. Each differential LC oscillator comprises a resonance circuit part with a respective capacitor C3, C4, C3', C4' and a respective inductor L1, L2, L1', L2'. Each differential LC oscillator further comprises a drive part with transistors T1, T1', T2, T2', resistors R1, R1', R2, R2', R3, R3' and capacitors C1, C1', C2, C2'.

The capacitors C3, C4, C3', C4' of the resonators are each illustrated as divided into two capacitors, this is to create optional fundamental frequency AC-ground points 640, 641. The inductors L1, L2, L1', L2' of the resonators are also each illustrated as divided into two inductors to thereby create a for this example necessary DC biasing points 650, 651 which also acts as fundamental frequency AC-ground points. Each differential oscillator further comprises one fundamental frequency AC-ground point 630, 631 and two combined fundamental frequency AC-ground and DC biasing points 610, 611, 620, 621. A fundamental frequency AC-ground point is a point where the fundamental frequency of the differential oscillator is effectively cancelled due to the symmetry of a differential oscillator. A fundamental frequency AC-ground further comprises only odd harmonics, i.e. even multiples of the fundamental frequency, the first harmonic being the dominant one.

According to a further enhancement of the invention, two super oscillators, as previously described, can be frequency locked together by AC coupling a fundamental frequency AC-ground point of one super oscillator with a fundamental frequency AC-ground point of the other super oscillator. By AC coupling these AC-ground points together, the super oscillators will strive to make the point as good an AC-ground point as possible and therefore adjust their phases in such a way that the first harmonics cancel. The super oscillators will therefore be 90° out of phase, i.e. in quadrature, and of the same frequency.

An AC coupling can be a direct coupling, a capacitor, a resistor, or the like. The fundamental frequency AC-ground points of the super oscillators that are coupled together are preferably the same type of point so that the coupled points have the same amplitude. Otherwise some sort of matching might be needed in the coupling. A super oscillator according to the invention comprises two fundamental frequency AC ground points for each type of point, one of each differential oscillator. This can be very advantageous for layout purposes and/or for coupling more than one super oscillator to a super oscillator. The frequency difference between two, or more, super oscillators that are to be frequency locked according to this enhancement of the invention should preferably only differ in frequency in the order of 10% or less.

Figure 7:
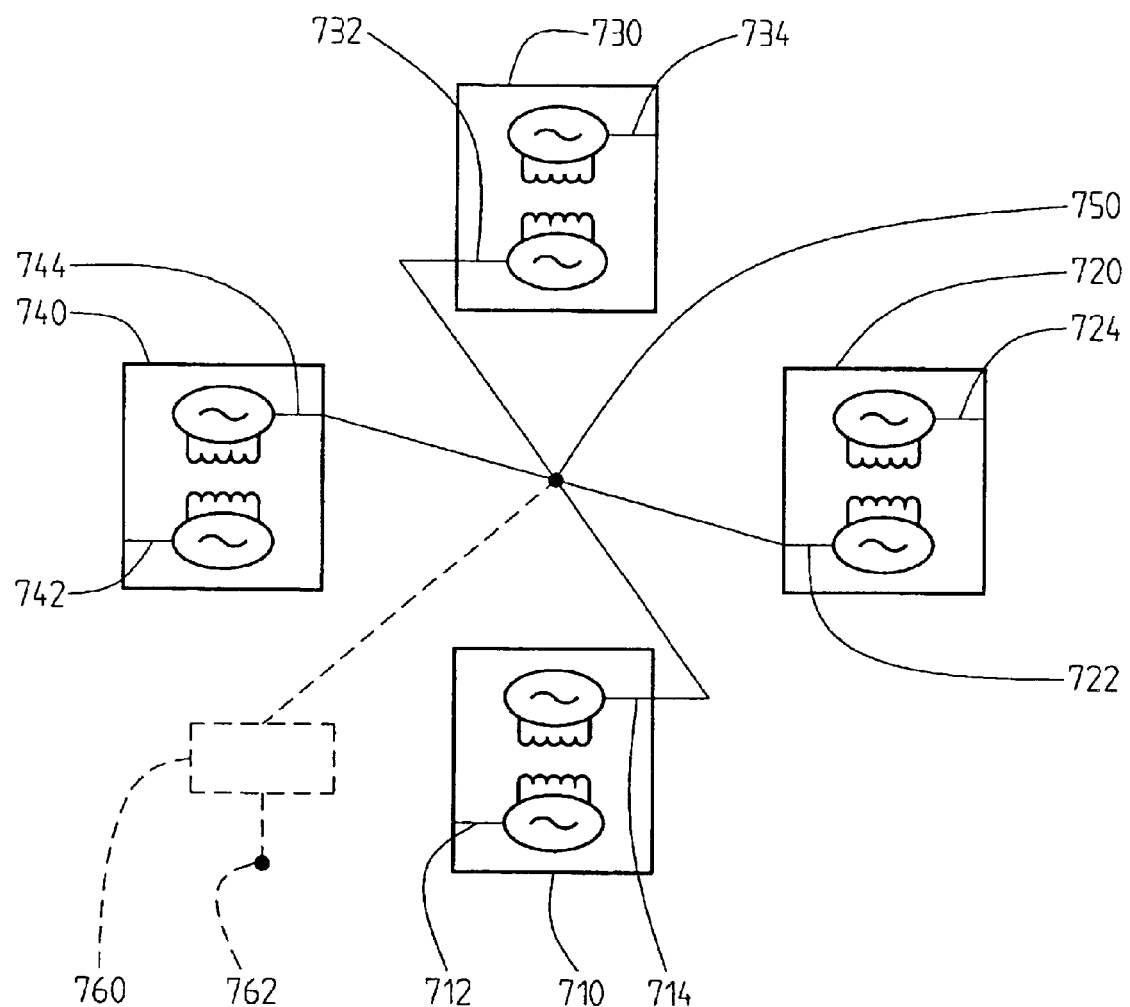
FIG. 7 shows a star configuration of locked oscillators according to the invention.

FIG. 7 shows an example of four super oscillators 710, 720, 730, 740 locked together according to the invention in a star configuration, i.e. a fundamental frequency AC-ground point 712, 714, 722, 724, 732, 734, 742, 744 of each super oscillator 710, 720, 730, 740 is AC coupled together 750. Each super oscillator 710, 720, 730, 740 comprises two differential oscillators locked together according to the invention as previously described. Each super oscillator comprises two fundamental frequency AC-ground points 712, 714, 722, 724, 732, 734, 742, 744 of the same type, which one to use will for example depend on layout. If the fundamental frequency AC-ground points used are of the DC biasing type as well, then a DC biasing impedance 760 might be needed as well as a DC-biasing point 762. More or fewer super oscillators can be frequency locked together in a star configuration such as this. To be noted is that a super oscillator can use a same fundamental frequency AC-ground point for AC-coupling to two or more other super oscillators.

Figure 8:
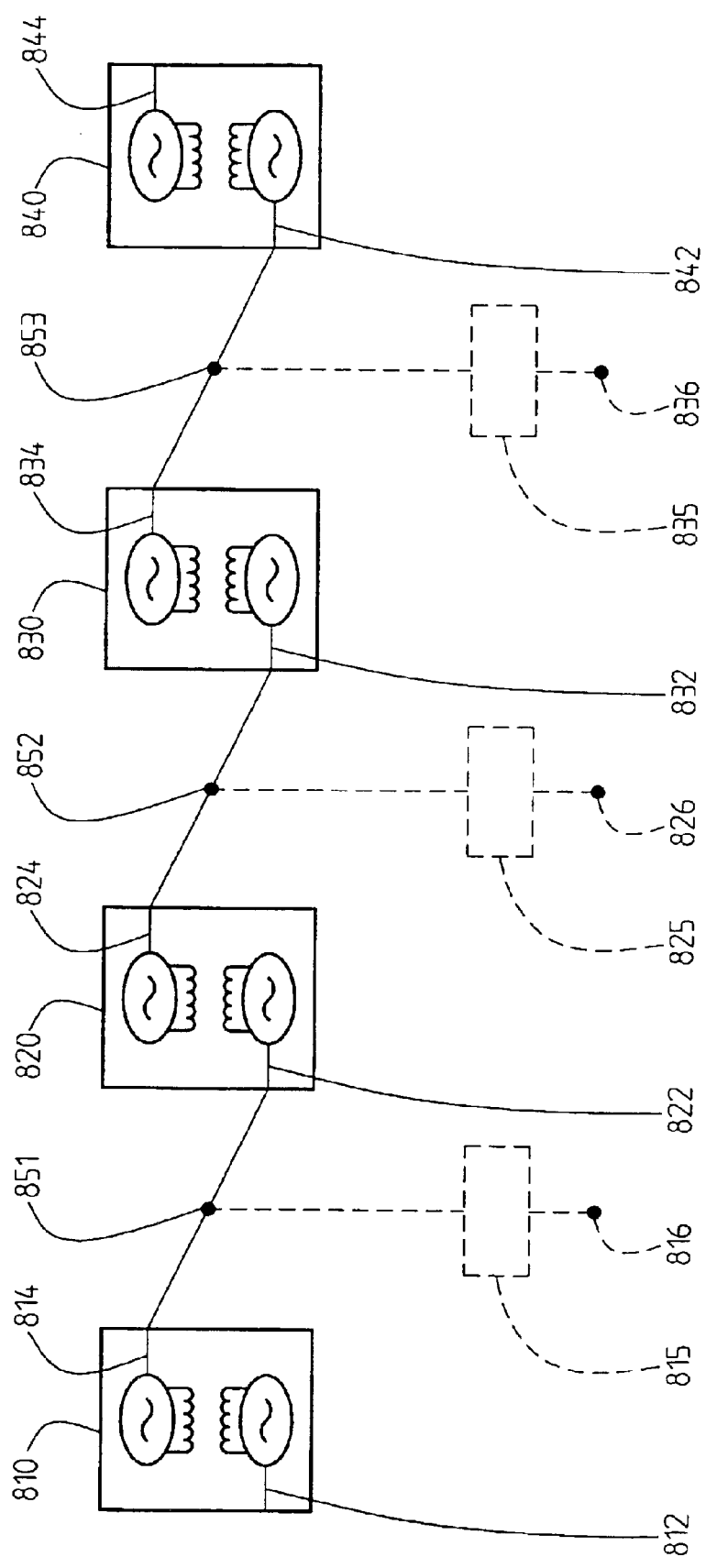
FIG. 8 shows a serial configuration of locked oscillators according to the invention.

FIG. 8 shows an example of four super oscillators 810, 820, 830, 840 frequency locked together according to the invention in a serial configuration, i.e. any super oscillator 810, 820, 830, 840 is not AC coupled together with more than two other super oscillators 810, 820, 830, 840 by means of the fundamental frequency AC-ground points 812, 814, 822, 824, 832, 834, 842, 844. In this example, a fundamental frequency AC-ground point 814 of a second differential oscillator of the first super oscillator 810 is AC coupled 851 together with a fundamental frequency AC-ground point 822 of a first differential oscillator of the second super oscillator 820. A fundamental frequency AC-ground point 824 of a second differential oscillator of the second super oscillator 820 is AC-coupled 852 together with a fundamental frequency AC-ground point 832 of a first differential oscillator of the third super oscillator 830. And a fundamental frequency AC-ground point 834 of a second differential oscillator of the third super oscillator 830 is AC coupled 853 together with a fundamental frequency AC-ground point 842 of a first differential oscillator of the fourth super oscillator 840. Optional DC biasing impedances 815, 825, 835 with corresponding DC biasing points 816, 826, 836 are indicated in the figure. More or fewer super oscillators can be frequency locked together in a serial configuration such as this. To be noted is that a super oscillator can use a same fundamental frequency AC-ground point for AC-coupling to two other super oscillators.

The basic principle of the invention is to frequency lock LC oscillators to each other by a mutual inductance coupling between resonance inductors of the LC oscillators. In an enhancement of the invention a super oscillator comprising two differential LC oscillators frequency locked by mutual inductance coupling of their resonance inductors, is frequency locked to one or more other super oscillators by AC coupling together fundamental frequency AC-ground points of the super oscillators. The invention is not restricted to the above described embodiments, but may be varied within the scope of the following claims.

What is claimed is:

1. An oscillator circuit comprising a first LC-oscillator and a second LC-oscillator, the first LC-oscillator comprising a resonance inductor, the second LC-oscillator comprising a resonance inductor, the first LC-oscillator and the second LC-oscillator having substantially the same fundamental frequencies, wherein the resonance inductor of the first LC-oscillator is coupled by mutual inductance to the resonance inductor of the second LC-oscillator to thereby enable the first LC-oscillator and the second LC-oscillator to frequency lock to each other, and wherein the LC-oscillators are differential LC-oscillators, each differential LC-oscillator comprising at least one fundamental frequency AC-ground due to differential symmetry.

2. An oscillator arrangement comprising an arbitrary number of oscillator circuits, each oscillator circuit being according to claim 1, wherein the oscillator arrangement comprises an arbitrary number of AC couplings between fundamental frequency AC-ground points of the oscillator circuits, thus frequency locking the oscillator circuits.

3. A communication unit, characterized in that the communication unit comprises an oscillator circuit according to claim 1.

4. The oscillator circuit according to claim 1, wherein the oscillator circuit comprises an arbitrary number of further LC-oscillators, each further LC-oscillator comprising a resonance inductor, and in that each of the resonance inductors of the further LC-oscillators is coupled by mutual inductance to at least one of the other resonance inductors of the other LC-oscillators.

5. The oscillator circuit according to claim 1, wherein the mutual inductance coupling between the resonance inductors of the LC-oscillators is achieved by at least partly intertwining the inductor windings of the respective resonance inductors which are inductively coupled by mutual inductance.

6. The oscillator circuit according to claim 1, wherein the LC-oscillators have substantially identical circuitry.

7. The oscillator circuit according to claim 1, wherein a fundamental frequency of the LC-oscillators is substantially a same frequency for all of the LC-oscillators.

8. An oscillator arrangement comprising a first oscillator circuit and a second oscillator circuit, each oscillator circuit being according to claim 1, wherein the oscillator arrangement comprises a first AC coupling between one of the at least one fundamental frequency AC-ground points of the first oscillator circuit and one of the at least one fundamental frequency AC-ground points of the second oscillator circuit, thus locking the first oscillator circuit to the second oscillator circuit.

9. The oscillator arrangement according to claim 8, wherein the first oscillator circuit and the second oscillator circuit are substantially identical.

10. The oscillator arrangement according to claim 9, wherein the first AC coupling is between a first fundamental frequency AC-ground point of the first oscillator circuit and a first fundamental frequency AC-ground point of the second oscillator circuit, the first fundamental frequency AC-ground points being identical fundamental frequency AC-ground points.

11. The oscillator arrangement according to claim 10, wherein the oscillator arrangement comprises a second AC coupling between a second fundamental frequency AC-ground point of the first oscillator circuit and a second fundamental frequency AC-ground point of the second oscillator circuit, the second fundamental frequency AC-ground points being identical fundamental frequency AC-ground points.

12. The oscillator arrangement according to claim 8, wherein one AC coupling between two fundamental frequency AC-ground points is further coupled to a voltage source via an AC-impedance element.

13. The oscillator arrangement according to claim 8, wherein one AC coupling between two fundamental frequency AC-ground points is further coupled to ground via an AC-impedance element.

14. The oscillator arrangement according to claim 8, wherein one AC coupling between two fundamental frequency AC-ground points is a direct coupling.

15. The oscillator arrangement according to claim 8, wherein one AC coupling between two fundamental frequency AC-ground points is a resistive coupling.

16. The oscillator arrangement according to claim 8, wherein one AC coupling between two fundamental frequency AC-ground points is a capacitive coupling.

17. A communication unit, characterized in that the communication unit comprises an oscillator arrangement according to claim 8.

18. The oscillator arrangement comprises a fourth oscillator circuit according to claim 1.

19. The oscillator arrangement according to claim 18, wherein the first AC coupling is further AC coupled to a first fundamental frequency AC-ground point of the fourth oscillator circuit.

20. The oscillator arrangement according to claim 18, wherein the oscillator arrangement further comprises a third AC coupling between a fundamental frequency AC-ground point of the second oscillator circuit being separate from the first fundamental frequency AC-ground point of the second oscillator circuit and a corresponding fundamental frequency AC-ground point of the fourth differential oscillator.

21. The oscillator arrangement according to claim 18, wherein the fourth oscillator circuit has a fundamental frequency which is substantially the frequency of the fundamental frequency of the first and second oscillator circuit.

22. The oscillator arrangement according to claim 18, wherein the fourth oscillator circuit has a fundamental frequency which is substantially twice the frequency of the fundamental frequency of the first and the second oscillator circuit.

23. The oscillator arrangement according to claim 18, wherein the fourth oscillator circuit has a fundamental frequency which is substantially twice the frequency of the fundamental frequency of the third oscillator circuit.

24. The oscillator arrangement comprises a third oscillator circuit according to claim 1.

25. The oscillator arrangement according to claim 24, wherein the first AC coupling is further AC coupled to a first fundamental frequency AC-ground point of the third oscillator circuit.

26. The oscillator arrangement according to claim 24, wherein the oscillator circuit comprises a second AC coupling between a second fundamental frequency AC-ground point of the first oscillator circuit and a second fundamental frequency AC-ground point of the third oscillator circuit, the second fundamental frequency AC-ground points being identical fundamental frequency AC-ground points and separate from the first fundamental frequency AC-ground points.

27. The oscillator arrangement according to claim 24, wherein the third oscillator circuit has substantially a same fundamental frequency as the first and second oscillator circuits.

28. The oscillator arrangement according to claim 24, wherein the third oscillator circuit has a fundamental frequency which is substantially twice the frequency as the fundamental frequencies of the first and second oscillator circuits.

29. An oscillator circuit comprising a first LC-oscillator and a second LC-oscillator, the first LC-oscillator comprising a resonance inductor, the second LC-oscillator comprising a resonance inductor, the first LC-oscillator and the second LC-oscillator having substantially the same fundamental frequencies, wherein the resonance inductor of the first LC-oscillator is coupled by mutual inductance to the resonance inductor of the second LC-oscillator to thereby enable the first LC-oscillator and the second LC-oscillator to frequency lock to each other, and wherein the oscillator circuit comprises a third LC-oscillator, the third LC-oscillator comprising a resonance inductor, and in that the resonance inductor of the third LC-oscillator is coupled by mutual inductance to at least one of the other resonance inductors of the other LC-oscillators.

30. The oscillator circuit according to claim 29, wherein the oscillator circuit comprises a fourth LC-oscillator, the fourth LC-oscillator comprising a resonance inductor, and in that the resonance inductor of the fourth LC-oscillator is coupled by mutual inductance to at least one of the other resonance inductors of the other LC-oscillators.

31. A method of frequency locking a first LC-oscillator to a second LC-oscillator, wherein the method comprises coupling by mutual inductance a resonance inductor of the first LC-oscillator with a resonance inductor of the second LC-oscillators, wherein the LC-oscillators are differential LC-oscillators, each differential LC-oscillator comprising at least one fundamental frequency AC-ground due to differential symmetry.

* * * * *